(12) United States Patent
Bernstein et al.

(10) Patent No.: US 11,996,845 B2
(45) Date of Patent: May 28, 2024

(54) POWER CONVERTER SUITABLE FOR HIGH FREQUENCIES

(71) Applicant: Ariel Scientific Innovations Ltd., Ariel (IL)

(72) Inventors: Joseph B. Bernstein, Hashmonaim (IL); Ilan Aharon, Bruchin (IL)

(73) Assignee: Ariel Scientific Innovations Ltd., Ariel (IL)

( * ) Notice: Subject to any disclaimer, the term of this patent is extended or adjusted under 35 U.S.C. 154(b) by 39 days.

(21) Appl. No.: 17/626,857

(22) PCT Filed: Jul. 30, 2020

(86) PCT No.: PCT/IL2020/050844
§ 371 (c)(1),
(2) Date: Jan. 13, 2022

(87) PCT Pub. No.: WO2021/019542
PCT Pub. Date: Feb. 4, 2021

(65) Prior Publication Data
US 2022/0294430 A1   Sep. 15, 2022

Related U.S. Application Data

(60) Provisional application No. 62/881,436, filed on Aug. 1, 2019.

(51) Int. Cl.
*H03K 3/03* (2006.01)
*H02M 1/00* (2006.01)
*H02M 3/00* (2006.01)
*H02M 3/156* (2006.01)

(52) U.S. Cl.
CPC ........ *H03K 3/0315* (2013.01); *H02M 1/0054* (2021.05); *H02M 3/01* (2021.05); *H02M 3/1563* (2013.01)

(58) Field of Classification Search
CPC . H03K 3/0315; H03K 3/0322; H02M 3/1563; H02M 3/01
See application file for complete search history.

(56) References Cited

U.S. PATENT DOCUMENTS

| | | | |
|---|---|---|---|
| 2004/0032300 A1* | 2/2004 | Joordens | H03K 3/0315 331/57 |
| 2005/0017702 A1 | 1/2005 | Kernahan et al. | |
| 2005/0253649 A1 | 11/2005 | Miroshima | |

(Continued)

FOREIGN PATENT DOCUMENTS

WO   WO 2021/019542   2/2021

OTHER PUBLICATIONS

Schmid, Ulrich, Scott T. Sheppard, and Wolfgang Wondrak. "High temperature performance of NMOS integrated inverters and ring oscillators in 6H-SiC." IEEE Transactions on Electron Devices 47.4 (2000): 687-691. (Year: 2000).*

(Continued)

*Primary Examiner* — Ryan Johnson

(57) ABSTRACT

A switching circuit comprises a main switch element having a gate as a control input; and a ring oscillator connected as a driver circuit to the gate to drive the main switch via the gate. The basic circuit is used to build various components which have the property that they can work at very high frequencies.

12 Claims, 18 Drawing Sheets

(56) References Cited

U.S. PATENT DOCUMENTS

| | | | |
|---|---|---|---|
| 2015/0372665 A1* | 12/2015 | Tohidian | H03K 3/0315 331/57 |
| 2016/0164404 A1 | 6/2016 | Pillonnet et al. | |
| 2017/0170722 A1 | 6/2017 | Jung et al. | |
| 2017/0207751 A1 | 7/2017 | Kumbabatti | |
| 2017/0222604 A1 | 8/2017 | Abe et al. | |
| 2018/0019757 A1* | 1/2018 | Schober | H03L 7/0995 |
| 2018/0246161 A1 | 8/2018 | Bernstein | |
| 2019/0123740 A1 | 4/2019 | Chen et al. | |
| 2020/0153334 A1* | 5/2020 | Coustans | H02M 3/155 |
| 2020/0304018 A1* | 9/2020 | Chiang | H01L 27/0922 |

OTHER PUBLICATIONS

International Search Report and the Written Opinion dated Oct. 28, 2020 From the International Searching Authority Re. Application No. PCT/IL2020/050844. (21 Pages).

Du et al. "An Efficient SSHI Interface With Increased Input Range for Piezoelectric Energy Harvesting Under Variable Conditions", IEEE Journal of Solid-State Circuits, 51(11): 2729-2742, Aug. 10, 2016.

International Preliminary Report on Patentability dated Feb. 10, 2022 From the International Bureau of WIPO Re. Application No. PCT/IL2020/050844. (9 Pages).

* cited by examiner

POWER CONVERTER SUITABLE FOR HIGH FREQUENCIES

RELATED APPLICATIONS

This application is a National Phase of PCT Patent Application No. PCT/IL2020/050844 having International filing date of Jul. 30, 2020, which claims the benefit of priority under 35 USC § 119(e) of U.S. Provisional Patent Application No. 62/881,436 filed on Aug. 1 2019. The contents of the above applications are all incorporated by reference as if fully set forth herein in their entirety.

FIELD AND BACKGROUND OF THE INVENTION

The present invention, in some embodiments thereof, relates to a power converter that is suitable for high frequencies and, more particularly, but not exclusively, to such a power converter that may be built into an integrated circuit.

Power converters rely on externally applied periodic signals to transfer energy from a source to a load through inductors, capacitors and switches. The limitation of externally controlled power converters is that the external periodic signals require critical design and complex design issues. Furthermore, the frequency of operation is limited by the efficiency of the drive transistors and diodes (including, generally, synchronous rectifiers).

Self-oscillating power converters exist that use one or two transistors in a simple multivibrator circuit or in a fly-back configuration. Generally, the power efficiency is limited by the transistor power dissipation.

Existing converters, particularly for high frequencies, are relatively large in size and their efficiency gets poorer as the frequency rises. Yet, a high frequency converter that is small enough to be built into an integrated circuit is highly desirable for fields as diverse as autonomous cars, space equipment and others.

Electric energy converters, which can effectively interface energy storage devices such as batteries, supercapacitors and reversible fuel cells to power conversion systems within applications of electrical vehicles (EVs), renewable energy generation (REG), uninterruptible power supplies (USPs) etc., have gained increasing attention in academia and industry over the last decade. Moreover, with the emergence of applying wide bandgap devices such as Silicon Carbide (SiC) and Gallium Nitride (GaN) based power switches, power electronic converters tend to be even faster, smaller and more efficient, due to the increased electrical field strength and electron mobility compared to silicon (Si) based counterparts. A high switching frequency, to some extent, can certainly offer opportunities for converter volume reduction and thereby obtain higher power density and more compact design. However, it is also accompanied by new challenges, for instance, increased switching losses even with wide bandgap devices, worse electromagnetic interference (EMI) and more stress on magnetic components. Therefore, soft-switching technologies, including zero-voltage switching and zero-current switching, are still widely used in the field of applications of wide band-gap semiconductors. High-frequency soft-switching GaN-based implementations under boundary conduction mode have been reported in the literature, in which the reduction of switching loss can well compensate for the increased conduction loss. For instance, a 5-MHz boost converter with efficiency up to 98% was demonstrated. A boost converter is a converter that converts a lower voltage into a higher voltage. A non-inverting Buck-Boost converter, as shown was proposed, and it is able to achieve full good operation, as well as flexible and easy control, which is significantly better than resonant converters such as Class-E DC-DC converters. More recently a high switching frequency GaN-based bidirectional DC-DC converter has been presented, which may achieve relatively high efficiency and high power density by careful design, in particular selecting an optimum dead time. The converter shows that the conduction loss increases accordingly when the dead time is longer due to the larger forward voltage drop of GaN devices, and thus a problem arises in that setting up ideal switching conditions for GaN devices is more difficult than for their silicon-based counterparts.

A similar issue arises with class-D amplifiers. Class D, or switching, amplifiers are those in which the amplifying devices act as switches. The existing class-D amplifiers today are relatively large in size and their efficiency is poor. These characteristics are particularly crucial when applied in autonomous cars, space equipment and others.

SUMMARY OF THE INVENTION

The present embodiments may overcome the problem of switching dead time by using a three phase or three stage ring oscillator as the basis for the converter. The ring oscillator may inherently provide a more effective power conversion due to precise timing within the ring oscillator stages.

The present embodiments may implement a converter using GaN technology in a ring oscillator configuration. The ring oscillator circuit may generate its own conversion frequency which may be much higher than controlled circuitry. The ring oscillator may be provided in multiple stages, for example two stages, three stages, five stages etc. Increasing the number of stages or phases decreases the ripple and allows for higher voltages. Arranging multiple stages in a sequence of steps allows for an increase in current and thus power as well.

In the case of a class D amplifier, embodiments may provide an odd-phase switching (Class-D) power amplifier based on GaN devices and ring oscillator circuitry. The amplifier may be efficient to very high frequencies, even RF, with high efficiency and small size compared to the existing systems.

According to an aspect of some embodiments of the present invention there is provided a power converter comprising an input, a power output and a plurality of ring oscillator stages connected between said input and said power output, the ring oscillator stages each comprising at least one enhancement mode transistor.

In an embodiment, said ring oscillator stages respectively comprise a second enhancement mode transistor.

In an embodiment, the at least one enhancement mode transistor is at least one member of the group consisting of a SiC transistor and a Gallium Nitride transistor.

In an embodiment, the enhancement mode transistor is a wide bandgap transistor.

In an embodiment, a drive connection of a first stage is connected via an impedance to a following stage.

In an embodiment, at least one of said ring oscillator stages comprises a pull-up transistor and a pull-down transistor.

In an embodiment, said drive connection is between said pull-up transistor and said pull-down transistor.

In an embodiment, said impedance comprises an inductor.

In an embodiment, a drive connection of a final oscillator stage is connected via an impedance to a first ring oscillator stage.

In an embodiment, each ring oscillator stage is connected via an input impedance to said input.

In an embodiment, said input impedance comprises an inductance.

Embodiments may include a cascade of at least three of said ring oscillator stages.

According to a further aspect of the present invention there is provided a power converter comprising an input, a power output and a plurality of ring oscillator stages connecting said input to said output, wherein a drive connection of a first stage is connected via an impedance to a following stage.

In an embodiment, the impedance comprises at least an inductor.

In an embodiment, said ring oscillators respectively comprise at least two enhancement mode transistors.

In an embodiment, a drive connection of a final oscillator stage is connected via an impedance to a first ring oscillator stage.

The power converter may include three of said ring oscillators, each of said three ring oscillators driving a switch for a different phase of a three phase system.

According to a yet further aspect of the present invention there is provided an amplifier comprising an input, a power output and a plurality of ring oscillator stages connected between said input and said power output, the ring oscillator stages each comprising at least one enhancement mode transistor.

In an embodiment, a drive connection of a first ring oscillator stage is connected via an impedance to a following ring oscillator stage.

A drive connection of a final oscillator stage of the amplifier may be connected via an impedance to a first ring oscillator stage.

The amplifier may be a D-type switching amplifier.

A yet further aspect of the present invention may provide a switching circuit comprising: A main switch circuit having a gate as a control input; and A ring oscillator connected as a driver circuit to said gate to drive said main switch via said gate.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

DESCRIPTION OF SPECIFIC EMBODIMENTS OF THE INVENTION

Figure 1:
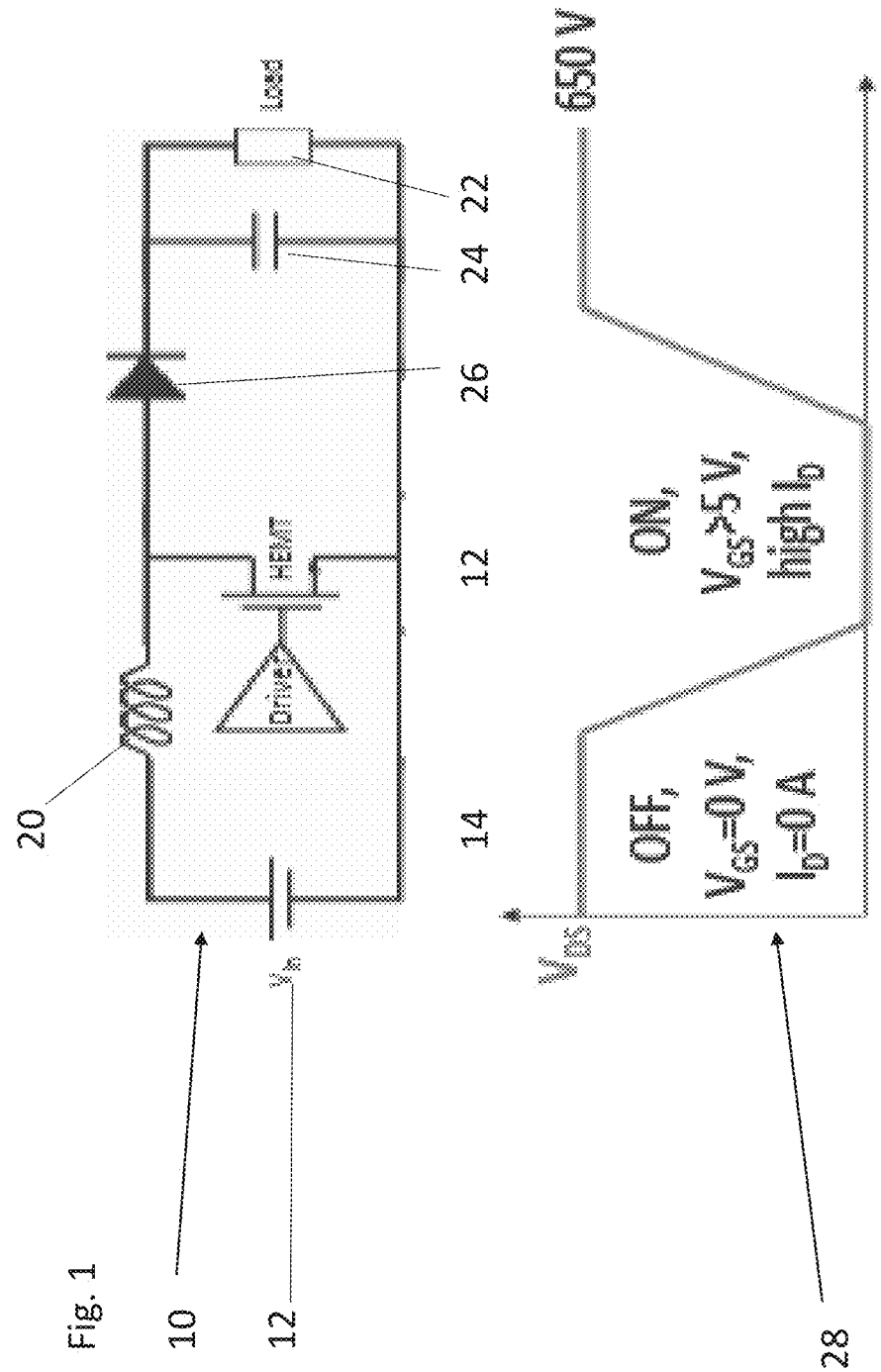
FIG. 1 is a simplified diagram showing a ring oscillator according to the existing art.

The present invention, in some embodiments thereof, relates to a high frequency power converter and, more particularly, but not exclusively, to a power converter that may be built on an integrated circuit.

The present embodiments may provide a multiple phase, interleaved power converter based on enhancement-mode only devices. Implementations may be employed in any electric storage system where high efficiency and miniature size are required and embodiments may achieve efficiencies of 90% at frequencies of 100 MHz and may be built into individual integrated circuits. The converter circuit consists of a ring oscillator having at least 2 stages with an ideal phase shift of 360°/N that may trigger the signal timing, and the converter circuit may be connected to the power output terminals. The converter circuit is related to the Ring Oscillator test circuit described in US Patent Application Pub. No US 2018/0246161 A1, the contents of which are hereby incorporated by reference herein in their entirety.

Ring oscillators are self-oscillating circuits whereby when sufficient voltage is applied to a chain of inverters, they are inherently unstable and immediately begin oscillations with applied voltage. This phenomenon is generally used in CMOS circuits to determine the characteristic properties of the transistors in use. The present embodiments address the problem of control by operating the devices at the natural ring frequency of 2 or 3 stage enhancement-mode only transistors, thus allowing a power converter to be built on the basis of ring oscillators. Feedback from the output voltage allows the boost converter to control either voltage or current at the output up to a maximum current or voltage that the transistors will allow.

The present embodiments may use a wide bandgap transistor, such as a high electron mobility transistor (HEMT) and an exemplary candidate is an enhancement mode, normally off Gallium Nitride (GaN) device, which may operate at very high natural frequencies and very low switching losses. An HEMT, also known as a heterostructure FET (HFET) or modulation-doped FET (MODFET), is a field-effect transistor which incorporates a heterojunction as the channel. The heterojunction replaces the doped region that is used in a MOSFET. Indeed, in recent years, gallium nitride HEMTs have attracted attention due to their high-power performance.

While there are self-oscillating converters, these are limited to one or two transistors as mentioned, and certainly none of them use multiple stages or a ring-oscillator configuration. A configuration of three equally phased ring oscillator stages may give a smooth power output at a maximum frequency determined by the speed of the switches, which for GaN-based transistors may be relatively high.

The current embodiments aim to provide an exemplary three or five phase power converter based on GaN devices. SiC devices may alternatively be considered. The converter may be employed in any electric storage system, with high efficiency and small size compared to the existing systems. The converter circuit may consist of multiple stages based on a ring oscillator, for example three stages. The three stage embodiment may have an ideal phase shift of 120° that may trigger signal timing which may be connected to the power output terminals.

In the case of a class-D amplifier, an odd-phase switching (Class-D) power amplifier based on GaN devices may be provided. The amplifier may be efficient to very high frequencies, even RF, with high efficiency and small size compared to the existing systems. The amplifier circuit may consists of a ring oscillator having say three or more stages, with an ideal phase shift of 360°/N that will trigger signal timing which may be connected to the power output terminals. The amplifier input may be the gate voltage of a common node connected to the load transistors of each phase (stage) so the input power will be very low compared to the power delivered at the output. The construction according to the present embodiments may guarantee high gain and high efficiency even at frequencies approaching, and even exceeding, GHz.

For purposes of better understanding some embodiments of the present invention, reference is first made to the construction and operation of a standard boost converter as illustrated in FIG. 1.

FIG. 1 shows simplified representations of a switching mode power converter 10 in boost configuration. High electron mobility transistor HEMT 12 is driven by driver 14 to operate load 16 from power supply 18 across inductor 20. The HEMT 12 is connected to load 16 across capacitor 24, and diode 26 prevents reverse voltages. Graph 28 is a simplified graphical representation of off and on states for the different operating regimes of the transistor in a boost converter.

In principle, in the boost converter of FIG. 1, each phase may have its own converter and high electron mobility transistor HEMT 12 may be provided as two GaN transistor devices in series, an upper device and a lower device. In such a case, the lower device would act as a control transistor and its voltage never goes above the gate voltage as guaranteed by the voltage of the upper transistor.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 2:
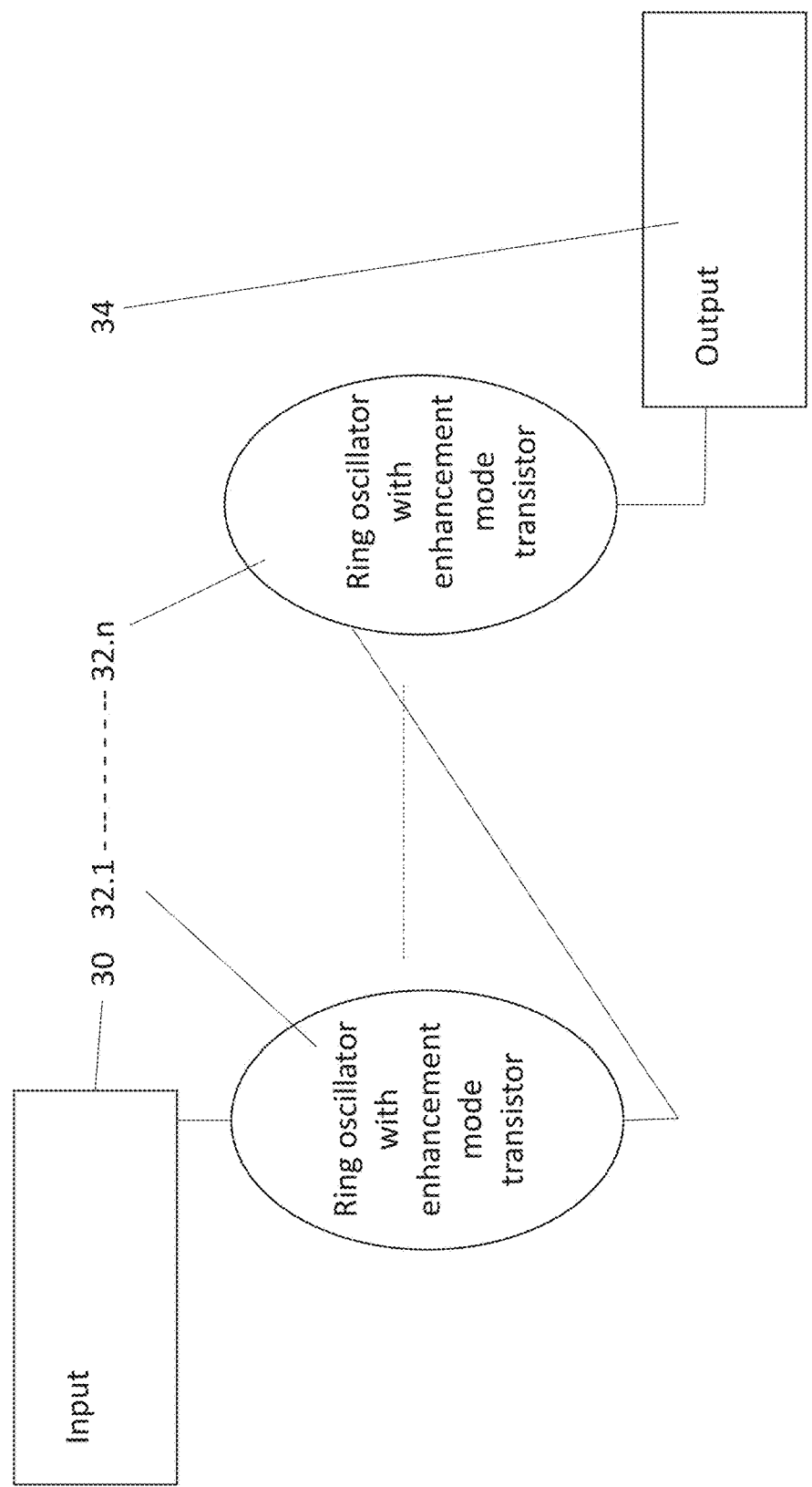
FIG. 2 is a theoretical diagram showing ring oscillator connected with enhancement mode transistors to drive an output according to a first embodiment of the present invention.

Reference is now made to FIG. 2, which is a simplified block diagram showing a circuit according to the present embodiments. An input 30 applies a signal via a sequence of ring oscillators 32.1 ... 32.n to a power output 32 to provide an amplified version of the input. The ring oscillator stages are thus connected between the input and the power output, and as will be explained in greater detail below, each of the ring oscillator stages comprises at least one enhancement mode transistor.

Figure 3:
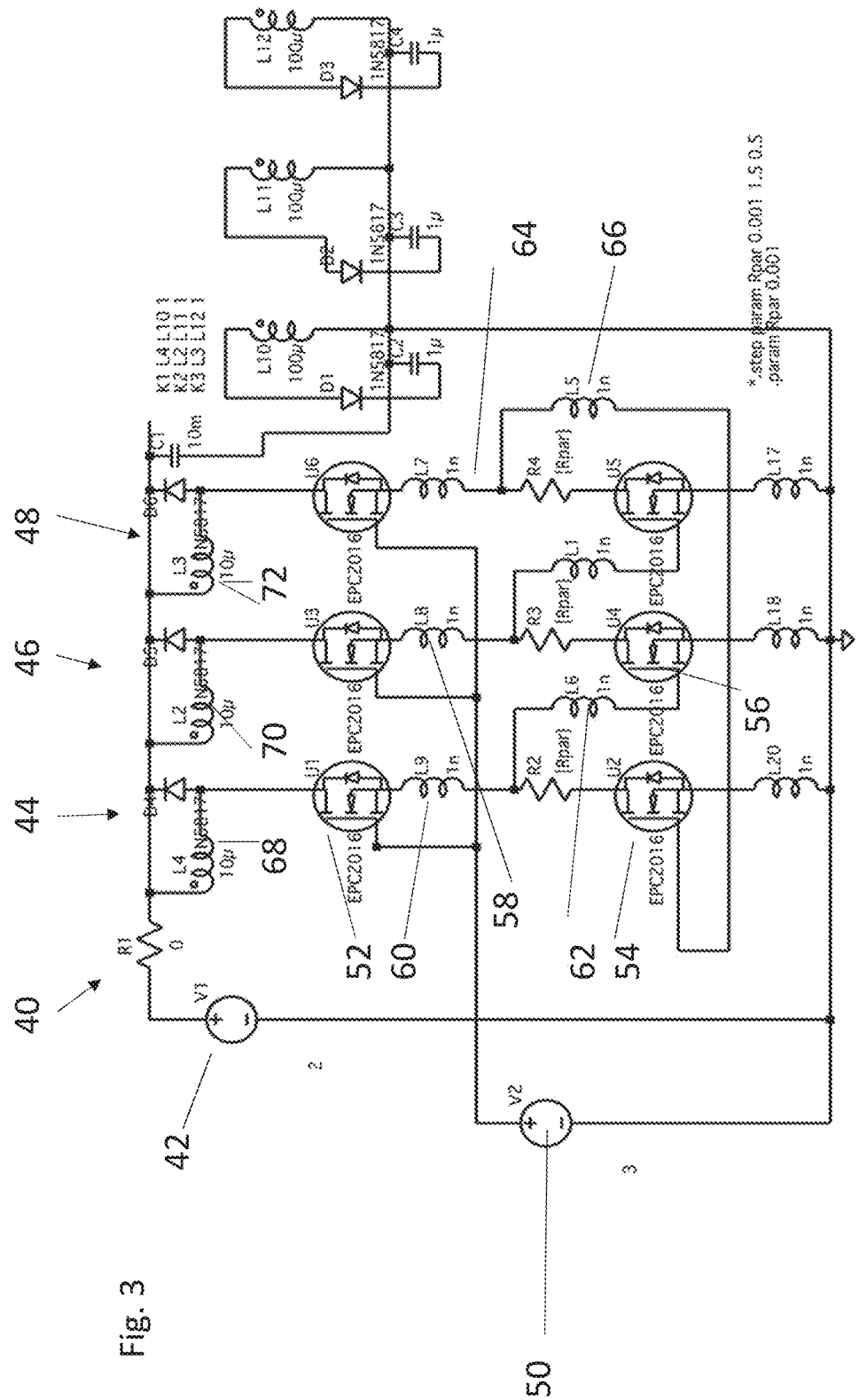
FIG. 3 is a circuit diagram of a simplified circuit using ring oscillators according to embodiments of the present invention.

Reference is now made to FIG. 3, which is an exemplary circuit diagram 40 corresponding to the block diagram of FIG. 2. In FIG. 3, a signal input V1 42 feeds three ring oscillators 44, 46 and 48. Each ring oscillator has an upper enhancement mode 52 transistor and a lower enhancement mode transistor 54. Power input 50 drives the gates of the upper enhancement mode transistors 52, and the outputs of the ring oscillators—in between the upper and lower enhancement mode transistors, drive the gates of the lower enhancement mode transistors 56 of the following stages.

The enhancement mode transistor may for example be a SiC transistor or a Gallium Nitride transistor, or more generally a wide bandgap transistor.

As shown in FIG. 3, a drive connection of any given stage is connected via an impedance 58, 60, to a gate of the following stage.

The ring oscillator stages may include a pull-up transistor and a pull-down transistor respectively, and the drive connection that is connected to the gate is between the pull-up transistor and the pull-down transistor. The impedance 58, 60, may be one or more inductors.

As shown in FIG. 3, the drive connection 64 of a final oscillator stage 48 is connected via an impedance 66 to the gate of transistor 54 of the first ring oscillator stage 44.

Each ring oscillator stage 44, 46, 48 is connected via an input impedance 68, 70, 72, to the input 42. The input impedances may be inductances as illustrated.

As shown in FIG. 3, a cascade of three of the ring oscillator stages may be used. In other embodiments, there may be five or seven such stages.

Thus, as shown in FIGS. 1 and 3, a power converter may be constructed from an input, a power output and ring oscillator stages connecting the input to the output. A drive connection of a first stage is connected via an impedance to a following stage, as discussed.

Likewise, as well as a power supply circuit, an amplifier may be constructed in the same way, to comprise an input, a power output and a plurality of ring oscillator stages connected between the input and the power output. As before, the ring oscillator stages each include one enhancement mode transistor and may include two such transistors in a pull-up, pull-down pair.

The embodiments may further comprise a switching circuit having a main switch circuit having a gate as a control input. A ring oscillator is connected as a driver circuit to the gate to drive the main switch via the gate.

In more detail, FIG. 3 illustrates a power converter according to the present embodiments, which is based on a ring oscillator circuit using GaN HEMT devices in a cascade configuration as linear drivers forming a 3-stage ring oscillator. The current in each leg flows only when both upper (load) and lower (drive) transistors are high. The upper transistors are all connected to the same voltage as the upper limit for the gate-to-source voltages for both upper and lower transistors. The voltage on the upper transistors is limited by the applied voltage plus the maximum drop across the top (load) inductors.

The principle of the circuit of FIG. 3 is that there is no control and all three phases are guaranteed to be 120° out of phase. The current in each phase is controlled by the voltage supply, V1-42. The resulting average voltage across the upper drain device is V1, while the current charges the inductors. The output current is taken from the secondary leads of each of the inductors indicated. A sample output showing the gate voltages of the lower transistor along with the drain voltage of the upper transistor is shown in FIG. 4.

Figure 4:
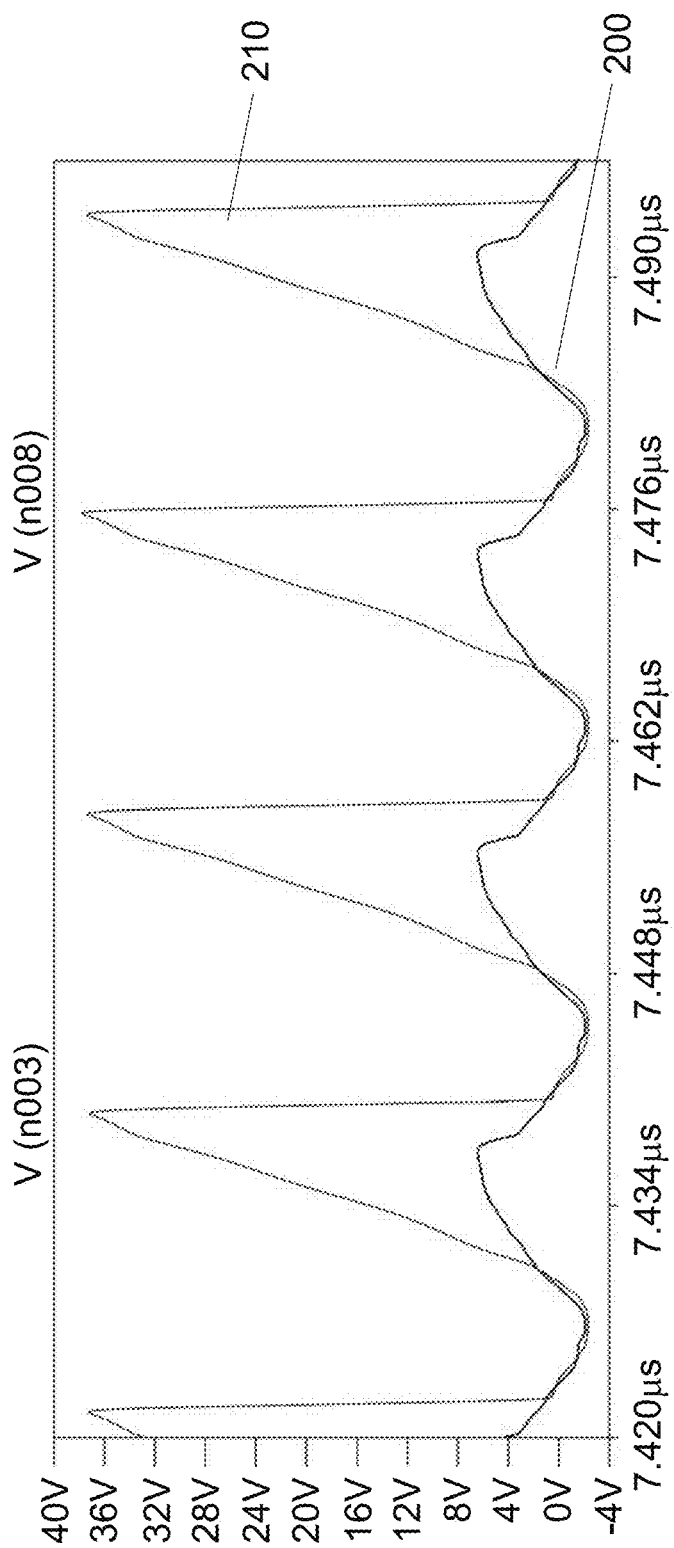
FIG. 4 is a graph showing voltages at two different locations in the simplified circuit of FIG. 3.
Figure 5:
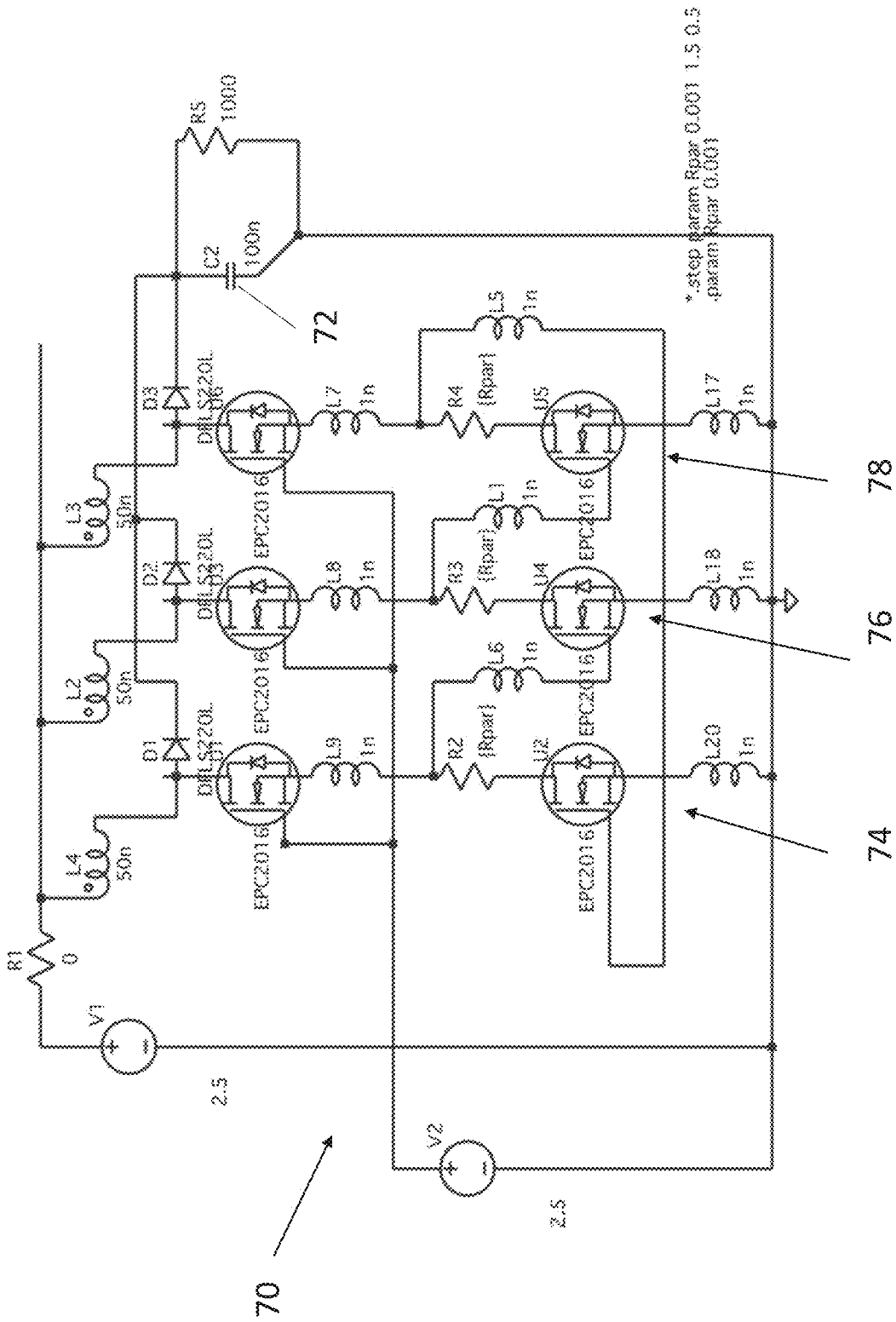
FIG. 5 is a simplified circuit diagram of a circuit using three ring oscillators according to embodiments of the present invention.

More particularly, FIG. 4 shows a SPICE simulation of one phase showing lower gate voltage 200 and upper Drain voltage 210. The Ring Oscillator (RO) platform of power converter delivers continuous power without any need for external frequency modulation or circuits. The result is an efficient boost converter operating at high enough frequency (16 MHz or greater) to minimize the needed inductors. A variation of the design of the present embodiments is shown in FIG. 5 in which a DC-DC converter 70 sends output from the drain to an output capacitor C2 72. Again three ring oscillators are shown 74, 76, and 78, although other numbers of oscillators may be used, in particular but not exclusively odd numbers such as 5 and 7. The ring oscillators are connected together as before, so that the oscillator drives the gate of the lower transistor of the following oscillator and the final oscillator is connected back to the first. An inductance of 10 nH is easily achieved by inserting a 1 cm trace in the circuit board. Such a self-oscillating device is based on a RO circuit using all GaN devices, having extremely low on-state resistance and very low gate capacitance, allowing for much higher frequency conversion in a self-regulating RO circuit.

Figure 6:
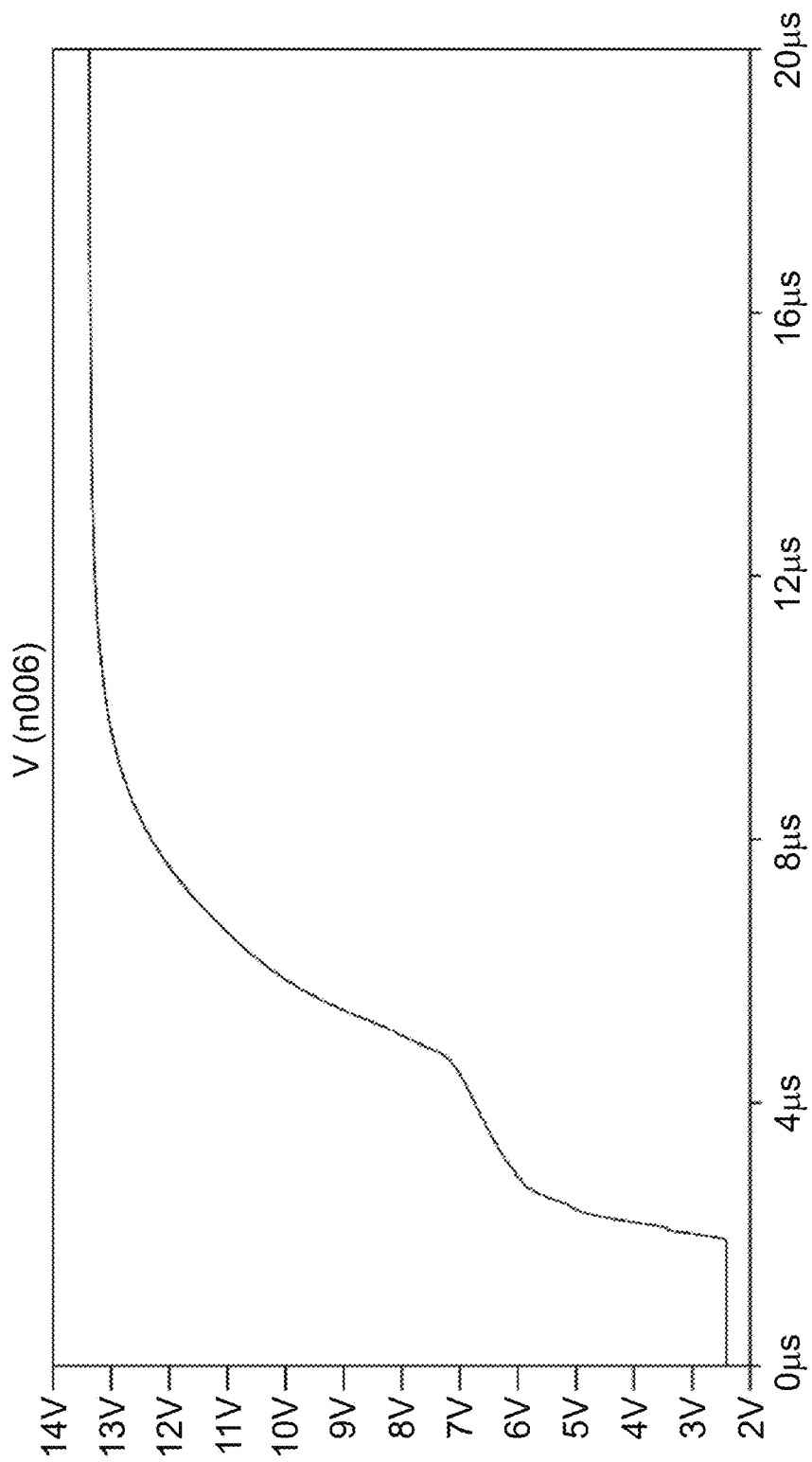
FIG. 6 is a graph of the switching voltage of the circuit of FIG. 5.

The resulting voltage and current waveforms have been simulated and are seen in FIG. 6 which shows that the voltage increases with each oscillation until the output power is met by the limitations of the boost transistors.

Figure 7:
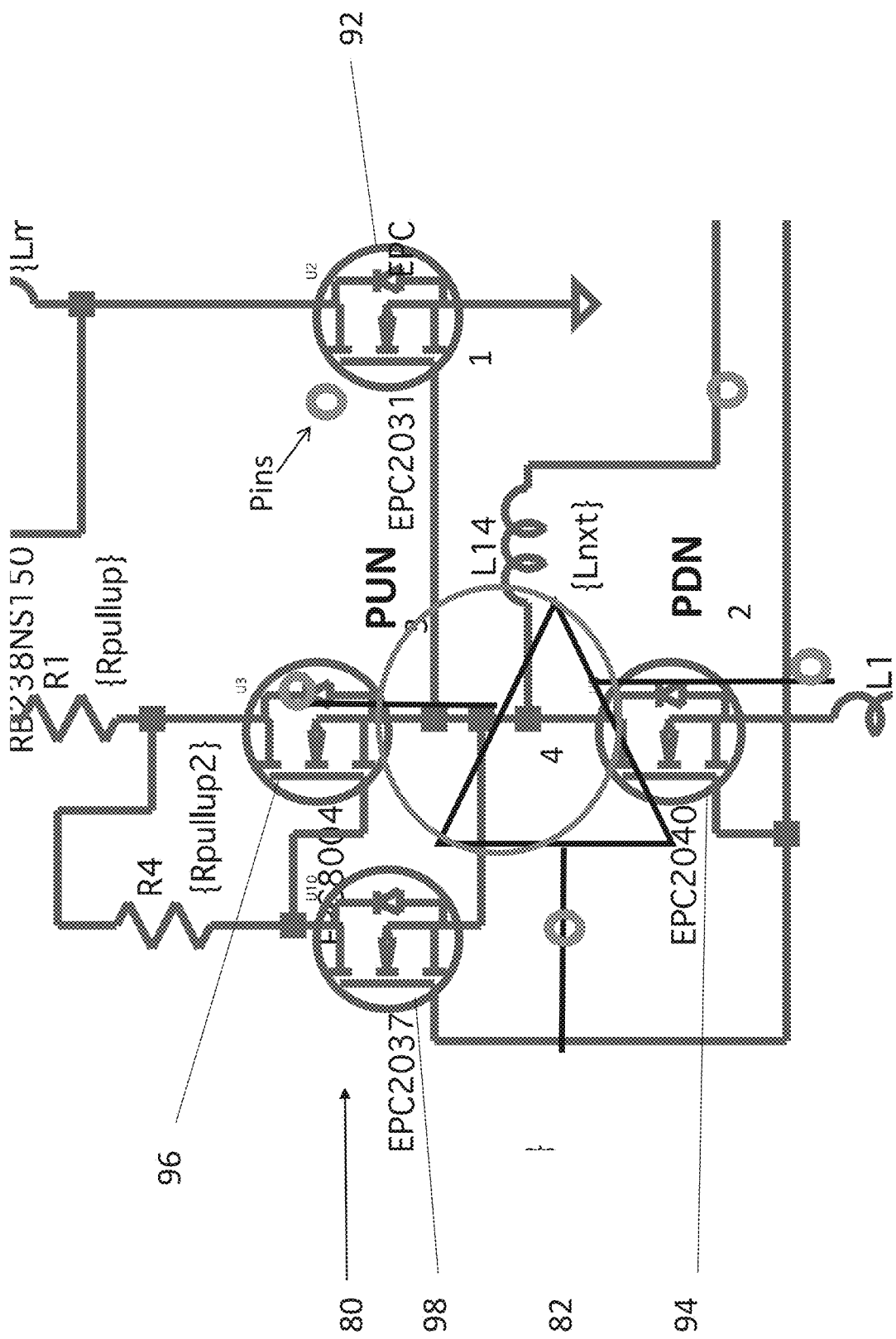
FIG. 7 is a diagram of a single stage of a multi-stage circuit in which an amplifier is isolated by pull up and pull down networks in a ring oscillator.

Reference is now made to FIG. 7, which is a simplified diagram showing a four transistor embodiment. It is known in the field that a rectifier can be replaced with a transistor to provide a Synchronous Rectifier. Simply, the synchronous rectifier is another power switch that can be controlled with isolated complimentary inputs. Since GaN devices are limited to operating as enhancement-mode only devices with limited allowed gate voltages, a specialized converter can be made with a basic ring oscillator acting as a rectifying switch connected to ground and the upper transistor of the ring oscillator can be connected to the high voltage. In circuit 80, a driver 82 is fully isolated by four transistors 92, 94, 96 and 98. The four transistors are of different sizes and hence of different capacitances, and numbered in order from largest to smallest the transistors viz: 92, 94, 96 and 98. The four transistors are connected in series to make oscillator converter. The circuit may be stacked in place of a rectifying switch since it is isolated.

Any number of tiles of the illustrated circuit maybe connected in series to get the appropriate power, although odd numbers such as 3, 5, 7 etc. are preferred.

An advantage of the circuit is that the only current drawn is to charge the main switch. Thus the power dissipated=$Q_{gs} \times V_g \times F$ and is thus proportional to frequency, giving for example at 50 MHz, 20 nC*3V*50 MHz~3 Watts per Stage.

The energy may be recovered, thus the loss in the switch is due to charging of the main switch. The loss may be recovered by discharging into the next gate. Hence, the use of inductances as pull up and pull down drivers and to provide feedback to the next stage.

Just recently (2018), a high switching frequency GaN-based bidirectional DC-DC converter was mentioned in the professional literature. It has shown that the conduction loss increases accordingly when the dead time is longer due to a larger forward voltage drop of GaN devices, thus setting up ideal switching conditions for GaN devices are more severe than their Si counterparts. The present embodiment may solve this problem in that three phase RO converters may inherently provide a more effective three phase conversion due to ideal precise timing within the ring oscillator stages.

Figure 8:
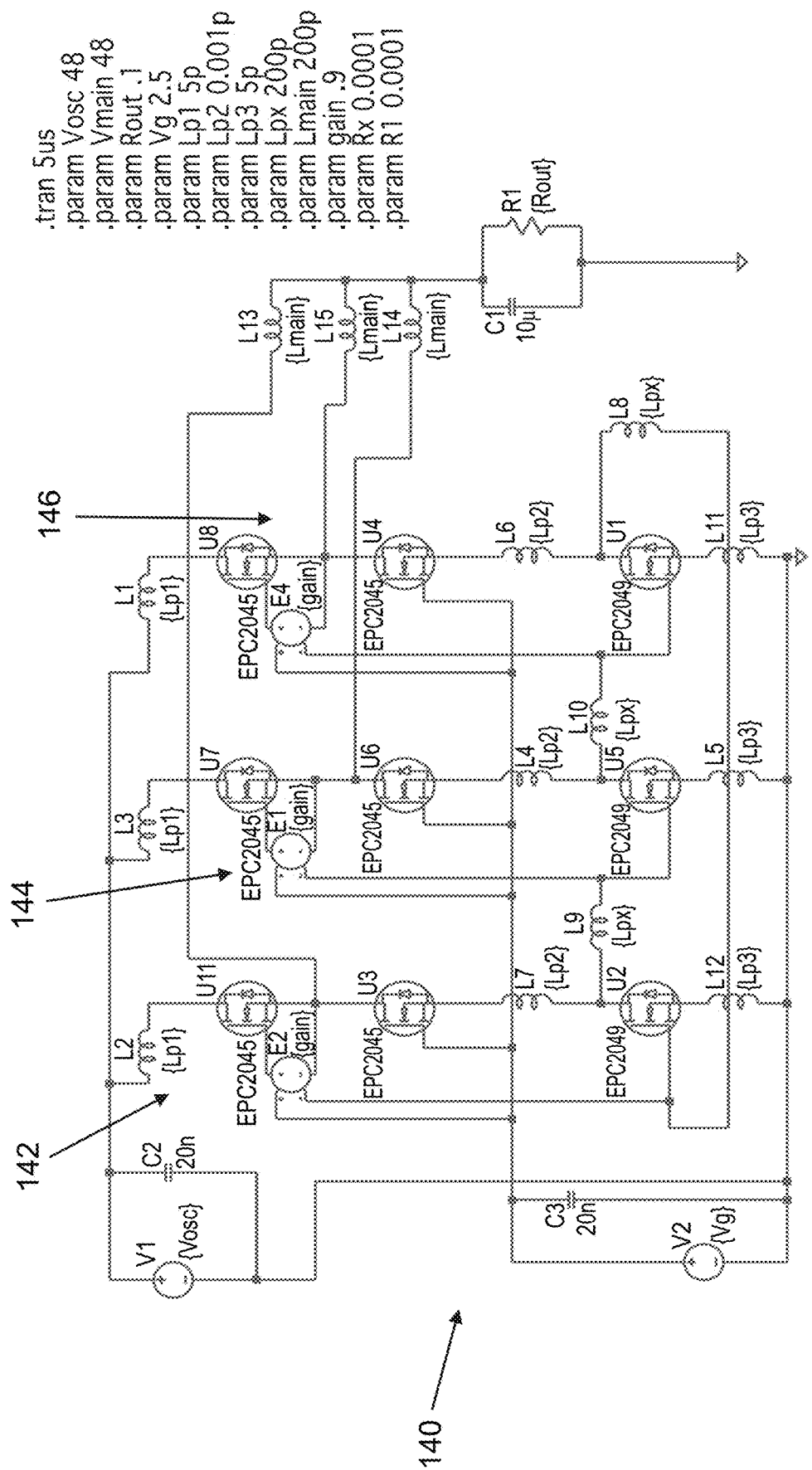
FIG. 8 is a three-ring-oscillator-stage circuit built using the units of FIG. 7 to form a buck circuit.

Reference is now made to FIG. 8, which is a simplified diagram showing a buck converter 140 made with ring oscillators 142, 144 and 146 according to embodiments of the present invention. It is well known in the field that the rectifier can be replaced with a transistor as a Synchronous Rectifier. Simply, the buck converter is another power switch that can be controlled with isolated complimentary inputs.

Since GaN devices are limited to operating as enhancement-mode only devices with limited allowed gate voltages, a specialized converter can be made with the basic ring oscillator having upper and lower transistors, the lower device acting as the rectifying switch connected to ground and the upper device can be connected to the high voltage, as shown in FIG. 8.

Figure 9:
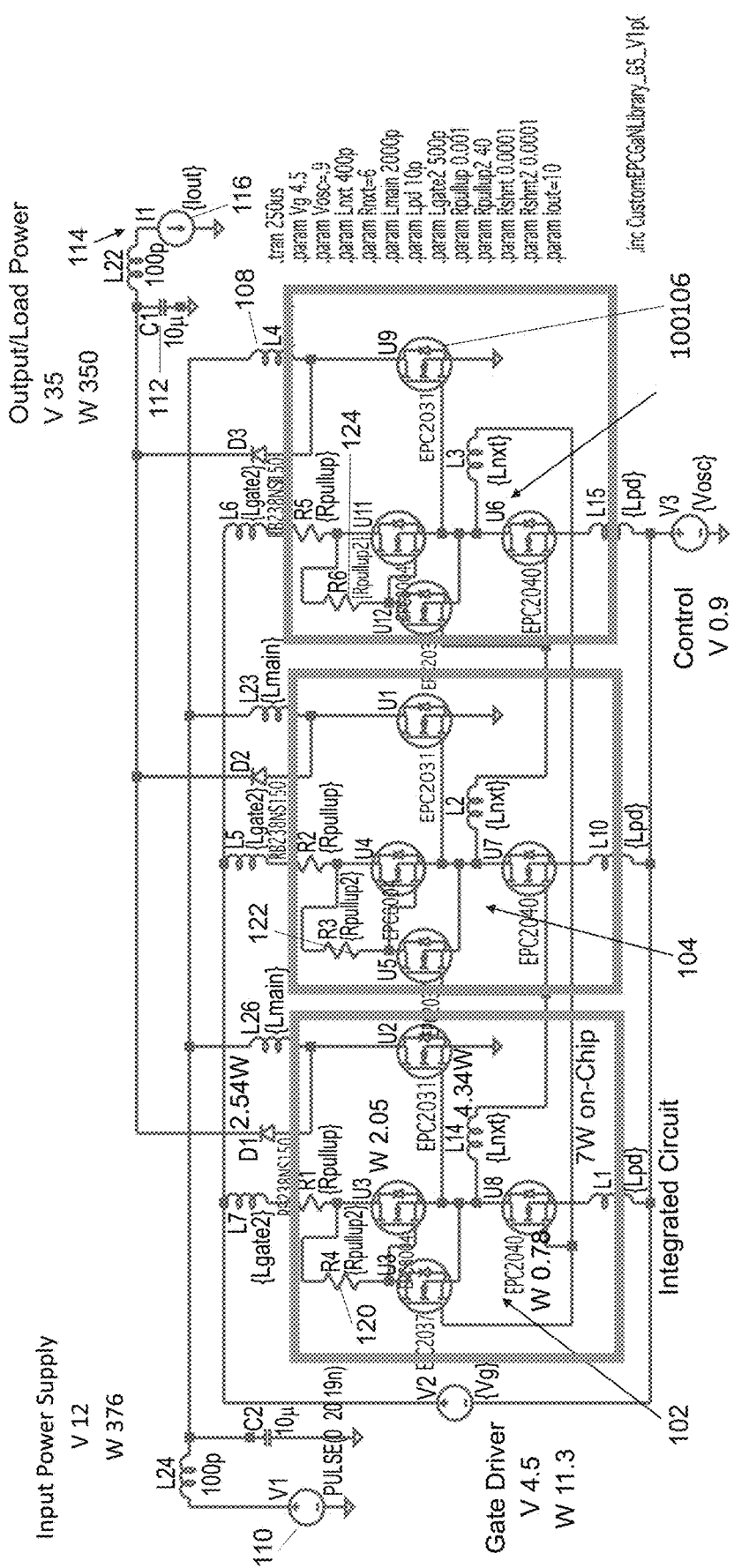
FIG. 9 is a three-ring-oscillator-stage circuit forming a boost circuit.

Reference is now made to FIG. 9, which is a simplified circuit diagram of a Boost converter made using ring oscillators according to an embodiment of the present invention. It is generally known in the field that a Boost converter, as mentioned, one that converts a lower voltage to a higher voltage, may be configured by reversing the coil and diode from a buck converter. The principle of operation involves having a switch short a supply voltage to ground through the inductor until the current increases to a maximum value before the switch is turned off. The voltage then commutates to the output diode (or synchronous switch). Such a converter can also be connected through a ring oscillator as shown in FIG. 9, where the gate of a main switch 100 is driven via a sequence of three ring oscillators 102, 104 and 106.

In FIG. 9, the main Switch 100 is connected to the output of the third RO circuit 106 at the gate. The gate is connected to the common node connection from stage 106, which RO stage is in turn connected to the common node connection of the preceding stage 104, and that to the common node connection of the first RO stage 102. Connected to the main switch 100 is main inductor 108. The main inductor 108 is the circuit element that transfers current from the supply voltage 110 to the output capacitor 112 and the output network 114. The output can be any electrical means of withdrawing the electrical energy from the output capacitor 112. In this example, the load is a current source 116. Frequency is determined by the gate resistors 120, 122, 124, which are combined with the input capacitance of the RO transistors (the gate capacitance). Two or more options can lead to control of the output voltage. The fixed gate voltage (Vg) selects the maximum gate-to-source voltage on all the transistors, which is a feature required by today's GaN power devices. The resulting output of the RO circuit drives the operation of the converter by modulating the oscillator voltage (Vosc). The voltage is chosen with respect to the threshold voltage of the main switch relative to the output of the common node from the RO circuit. Each circuit element is repeated N times based on the number of stages of the RO circuit. A prototype according to FIG. 8 was able to work at a frequency of 50 MHz.

Figure 10:
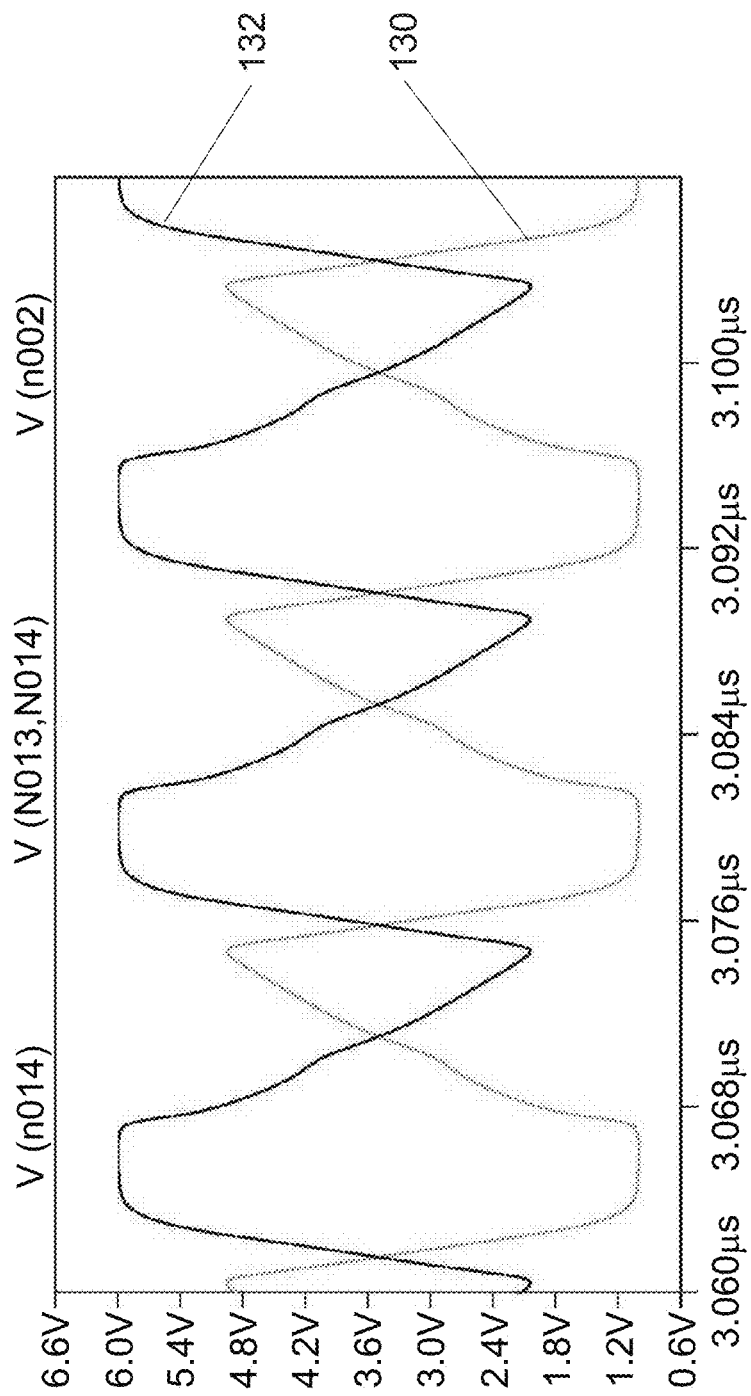
FIG. 10 is a simplified graph showing voltage outputs from the circuit of FIG. 9.

The output voltage from the RO cascade in FIG. 9 is shown in FIG. 10. Reference numeral 130 indicates the voltage seen at the gate-input to the main switch. In this example, Vosc=1V and Vg=7V. The result is a triangle wave, typical of a Pulse-Width Modulation (PWM) input of a standard buck, boost or buck-boost converter. In today's technology, there is a very strict requirement that the gate to source voltage never exceed 6 volts. The upper, load transistor guarantees this by maintaining a maximum voltage Vg, above which the common node may not exceed. Where there is an offset voltage applied at Vosc, the maximum voltage would be 6+Vosc, so 7V is the applied voltage at the gate node. FIG. 10 illustrates a voltage waveform 130 typical of the RO circuit measured at the common node and 132 the gate-to-source voltage for the load transistor of the RO circuit.

Figure 11:
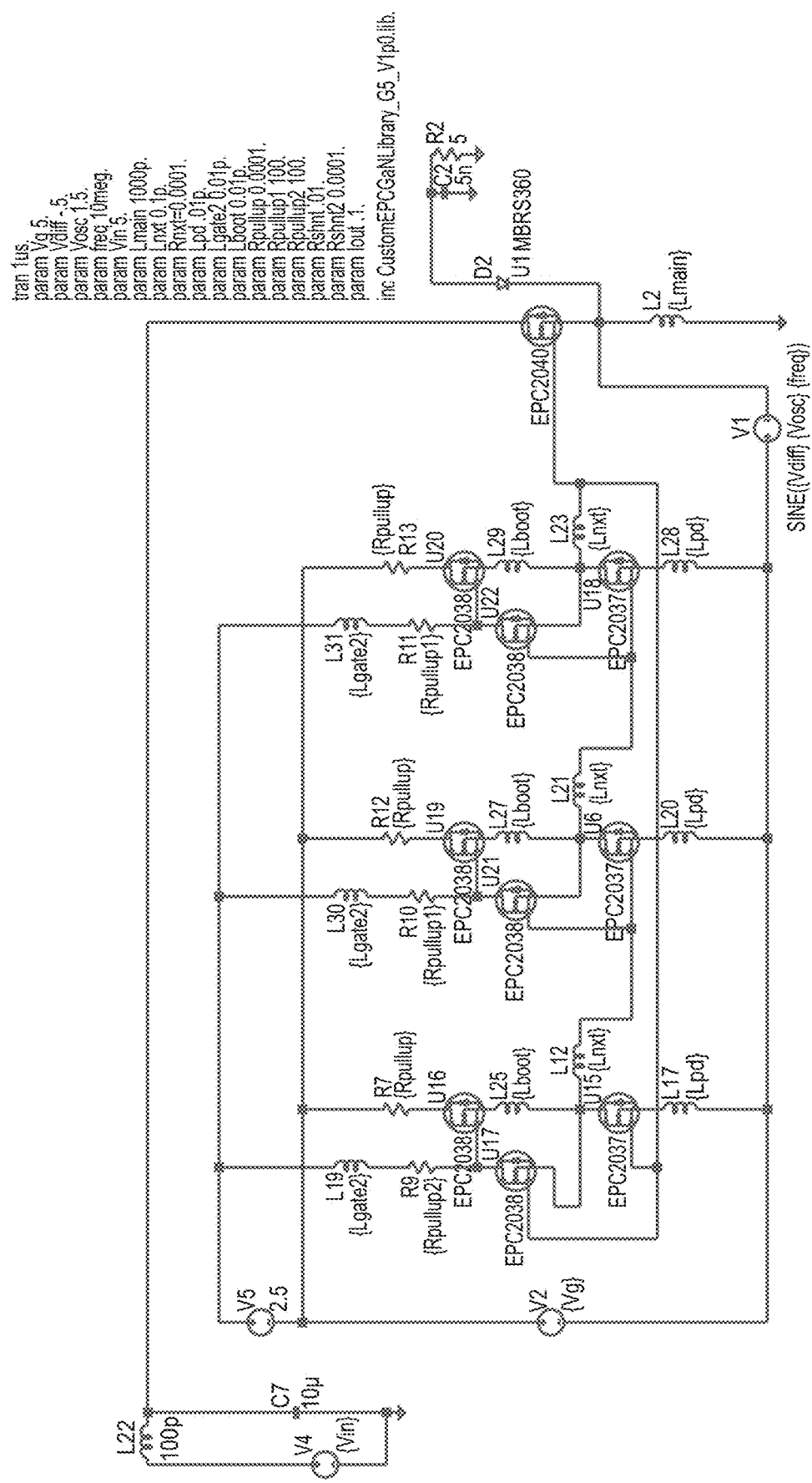
FIG. 11 is a simplified diagram of a D-type amplifier constructed using ring oscillators according to embodiments of the present invention.

Reference is now made to FIG. 11 which is a circuit diagram of a D-type amplifier using ring oscillators according to embodiments of the present invention.

The D-type amplifier 130 sends output from the drain to an output 132. Again three ring oscillators are shown 134, 1366, and 138, although other numbers of oscillators may be used, in particular but not exclusively odd numbers such as 5 and 7. The ring oscillators are connected together as before, so that the oscillator drives the gate of the lower transistor of the following oscillator and the final oscillator is connected back to the first.

The resulting DC to DC converter puts out a voltage signal that is directly proportional to the control voltage at the gate (V2) in the illustrated circuit. Hence, if the input signal is slow compared to the oscillation frequency, then the filtered output voltage will be a direct amplified image of the input voltage. In an example, the input voltage of 2.5V gives an output of over 12V, but that is driving a load of 1000 Ohms. Considering the input is only the gate voltage of the Load transistors (as shown) then the input power may be as low as 1 W with an output power as high as 100 W, giving very high power transfer gain.

The amplifier makes use of the ring oscillator circuit of the present embodiments and may include GaN HEMT devices in a cascade configuration as linear drivers forming a 3-stage ring oscillator. The current in each leg flows only when both upper (load) and lower (drive) transistors are in a "high" state. The upper transistors are all connected to the same voltage as the upper limit for the gate-to-source voltages for both upper and lower transistors. The voltage across the upper transistors is limited by the applied voltage plus the maximum drop across the top (load) inductors, indicated in the SPICE model.

The principle of this circuit is that there is no need for a precise pulse control and all the three phases are guaranteed to be 120° out of phase. The current in each phase is controlled by the main voltage supply, V1. The resulting average voltage across the upper drain device is V1, while the current charges the inductors. The output current is taken from the secondary leads of each of the inductors. The circuit may operate at over 100 MHz and prototypes have demonstrated GaN RO circuits up to 650 MHz. The output control occurs via simply providing feedback to the gate voltage (V2) so that the output is at the desired level. This has been implemented both in buck and boost versions. Buck-Boost and other applications are in the plans with the ability to make the converters as efficient as possible while maintaining very high frequency oscillation.

A working prototype of the device used small coils and inductances can be implemented as wire traces on the circuit board. The output voltage is across a 200 Ohm load showing about 2.5 to 1 conversion from the input voltage of 3.6 Volts. The prototype had an output voltage across a 200 Ohm load, for a main input voltage of 3.6 V and a control gate voltage of 2.3 V.

Figure 12:
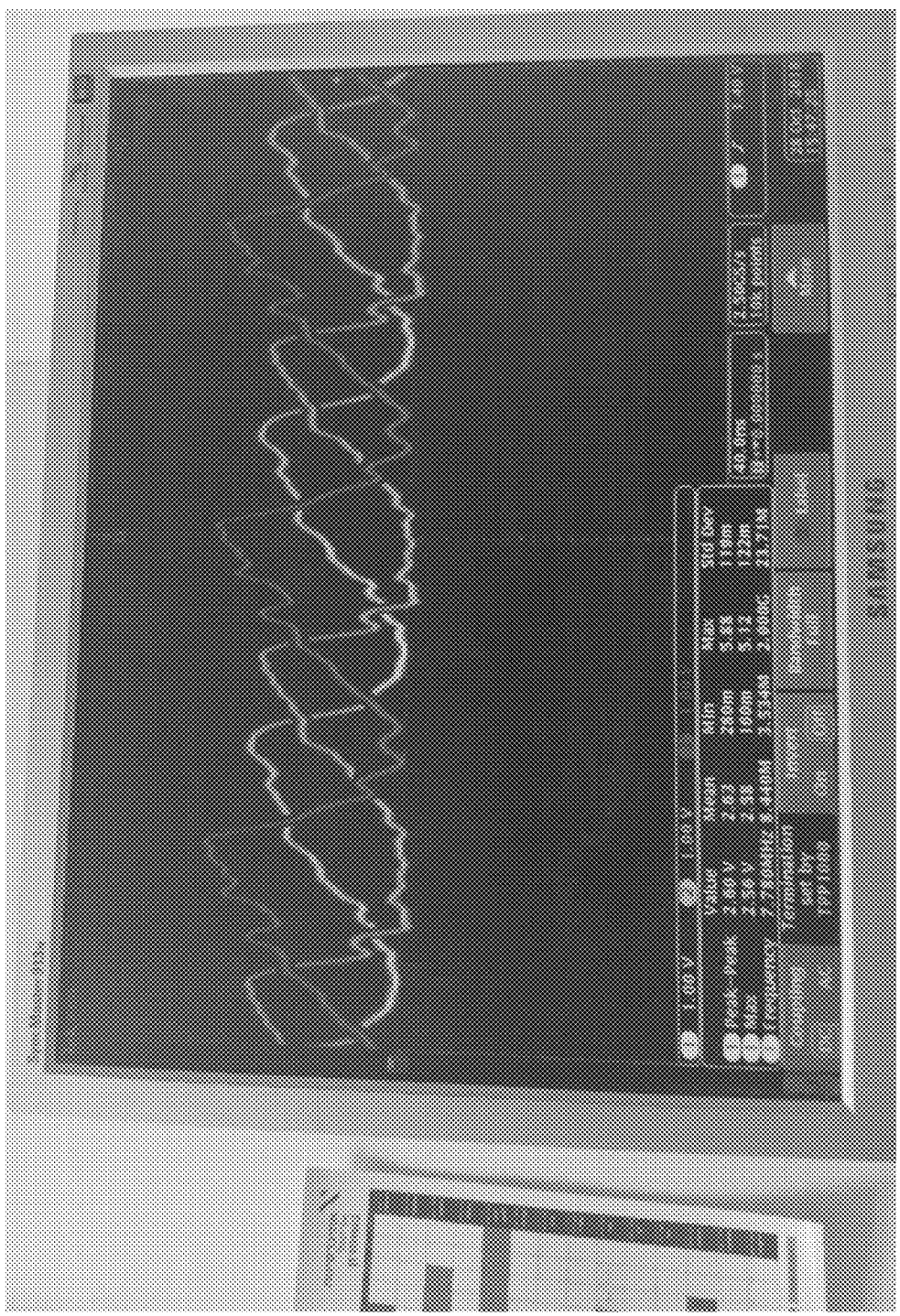
FIG. 12 shows the oscilloscope output for voltages at the three gates of a three-ring oscillator stage amplifier according to embodiments of the present invention.

The oscillation waveform is seen in FIG. 12, showing all 3 phases of the gate voltage, that is the gate voltage for each of the three oscillators. We see that the peak-to-peak voltage is 2.44 Volts, demonstrating excellent control on the lower voltage device. This teaches that the lower devices can be much lower capacity with high current while the upper devices can be very high voltage GaN devices. The circuit is operating at about 7.8 MHz allowing implementation with very small components.

Figure 13A:
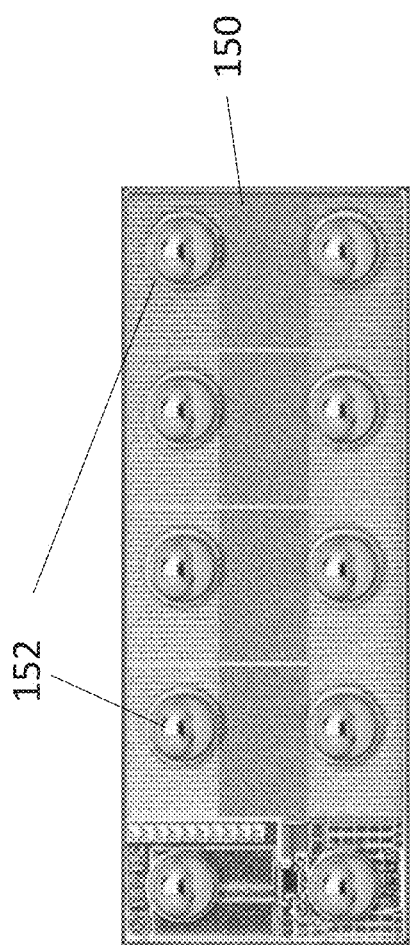
FIGS. 13A and 13B illustrate the underside of an integrated circuit with connector pins and an indication of how an additional pin can be used to connect between the different ring oscillator stages in an embodiment of the present invention.
Figure 13B:
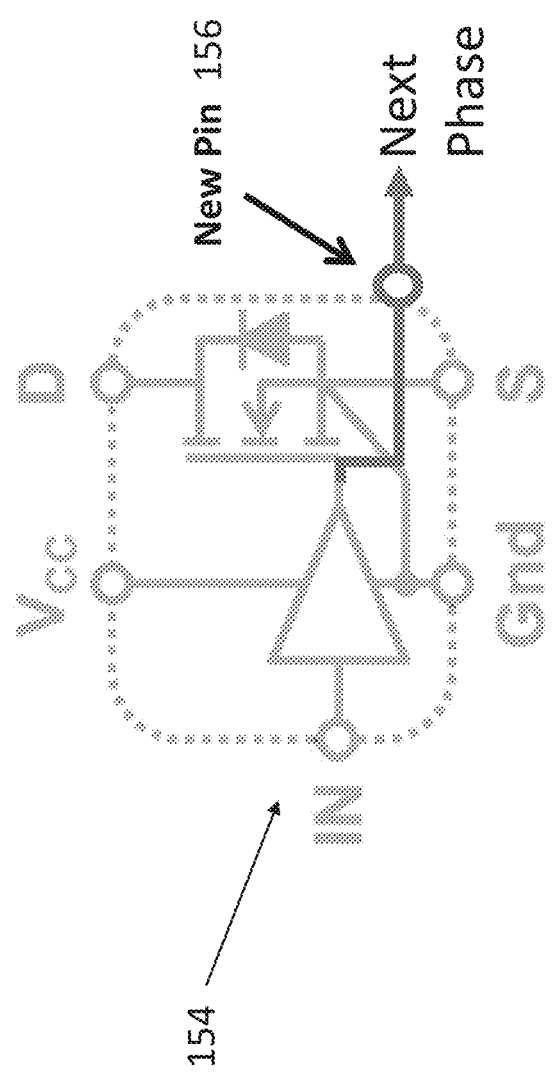

Reference is now made to FIGS. 13A and 13B, which are simplified diagrams illustrating how a circuit according to the present embodiments may be implemented on a single integrated circuit. FIG. 13A shows the underside of an integrated circuit 150 with pins 152 for electrical connections, not all of the pins being used in all cases. In order to construct a gate driver circuit 154 according to the present embodiments, a single additional pin 156 is needed to connect the common node to the next phase, account being taken of the need to reduce total gate resistance.

A prototype was made using the EPC2031 GaN enhancement mode power transistor.

The following features were noted:
C(input) 1640 pF 2000 pF max
(Rgate+Rdriver (pull-down))<250 mW
Achieved using Rgate=200 mW.
Rdriver kept to less than 50 mW (EPC2040 as the driver).
Pull-Down time ~1 ns.
Pull-Up time is made longer to allow control of Duty Cycle.
With EPC2037 (0.5 W Rds,ON) Pull-Up time ~3 ns.
Saturation time is ~1 ns*2 (high and low)
With 3 phases per ring chain, Fmax=1 GHz/[3*(4 ns+2 ns)]=55 MHz.

Figure 14:
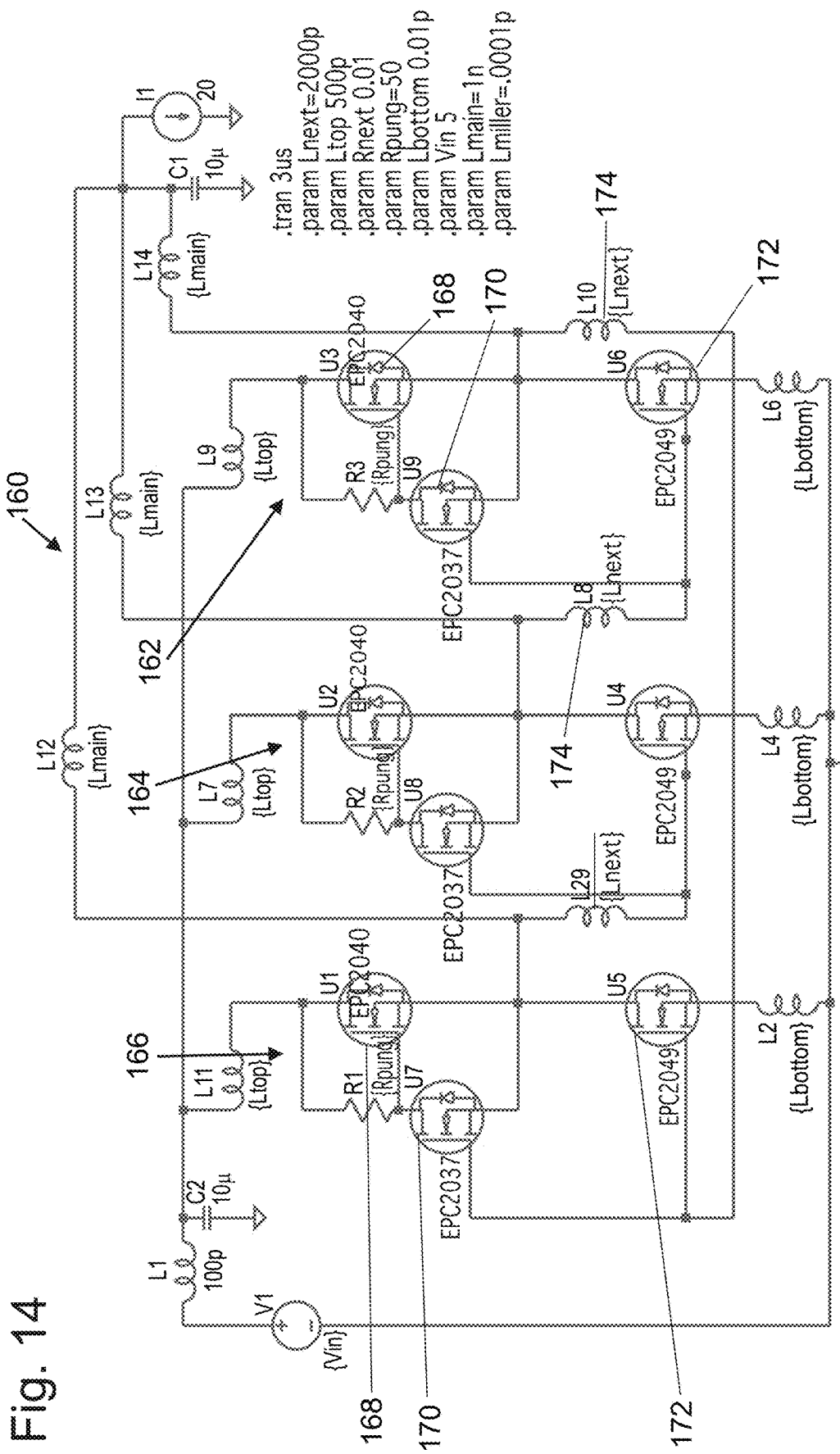
FIG. 14 is a simplified circuit diagram of a three-ring-oscillator boost circuit according to embodiments of the present invention.

Reference is now made to FIG. 14, which is a simplified circuit diagram of a switching circuit 160, again having three ring oscillators 162, 164 and 166. Two GaN transistors in each ring oscillator 168, 170, act as a pull up network and operate as a single PMOS. The corresponding pull-down network includes a single GaN transistor 172 that acts as a single NMOS. A connecting inductance between each ring oscillator, 174, acts as a filter and allows the drivers to be separated on different chips and connected together at package level.

Figure 15:
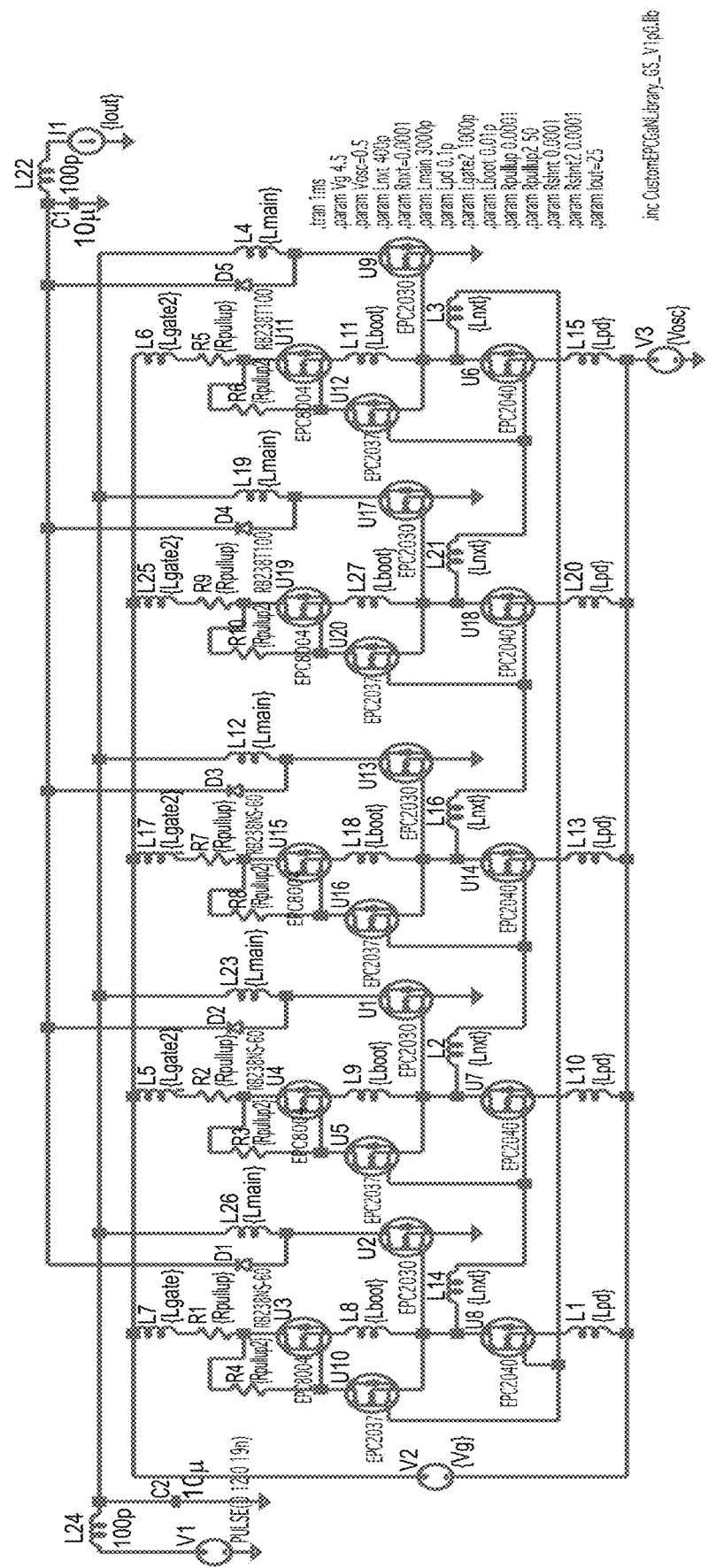
FIGS. 15, 16, 17, and 18 are three different five-ring-oscillator-stage circuits according to embodiments of the present invention.

Reference is now made to FIG. 15, which is a simplified diagram of a five stage switching circuit. In this circuit, working at 120 Watts per phase, pull down time is short compared to pull up time. More particularly the on time is three times as long as the off time, giving a 3:1 duty cycle. The duty cycle can be controlled by increasing the pull-up resistance. However if heading above 3:1, the efficiency goes down, as energy gets lost in the capacitors and the physical limits of the device are reached.

Figure 16:
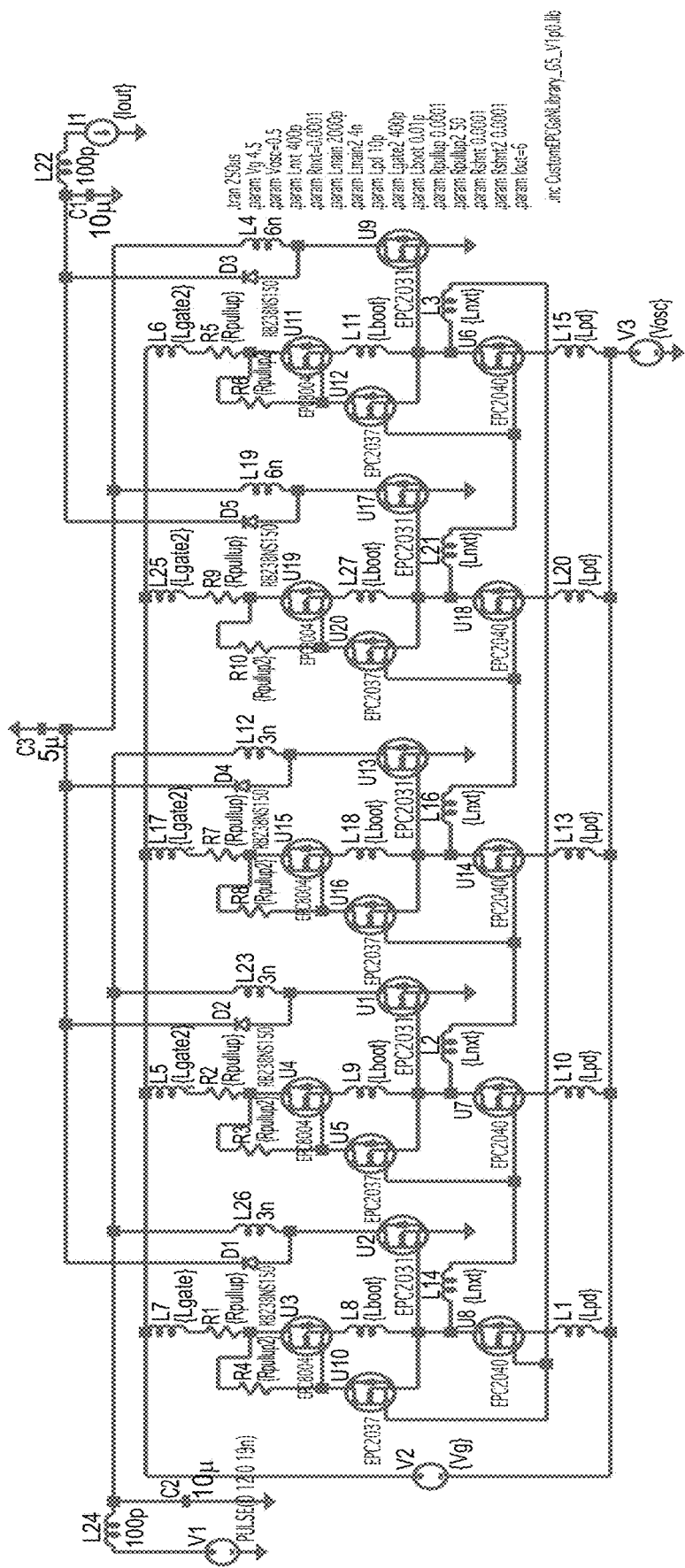
Figure 17:
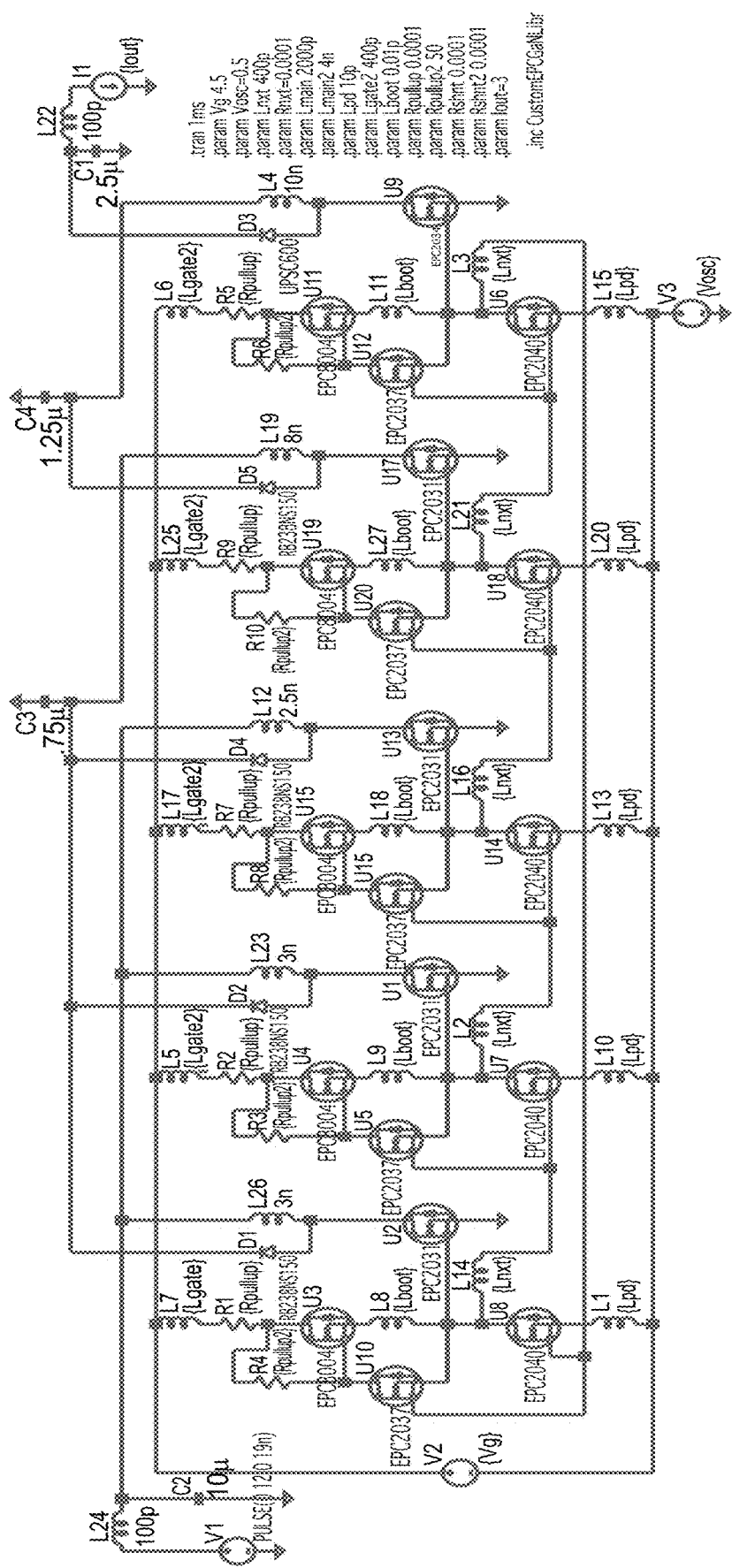
Figure 18:
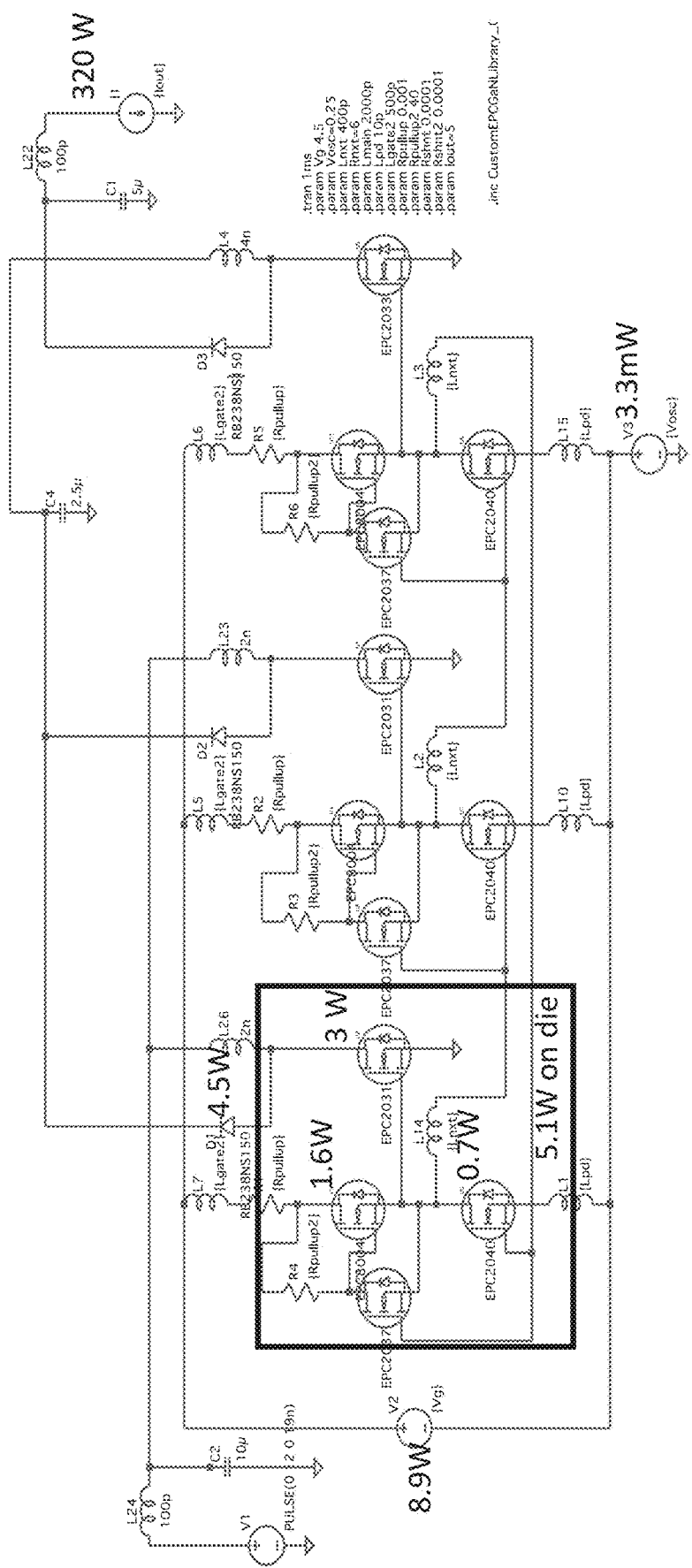

FIG. 16 is a similar five stage circuit and may be built as a single integrated circuit. Again the circuit has five ring oscillator stages, and a driver and pulse width modulation PWM together on the chip. Compared to the circuit of FIG. 15, this circuit has the same voltage but higher current and thus a greater energy density. As a result, it requires a slightly bigger inductor.

It is expected that during the life of a patent maturing from this application many relevant enhancement mode transistors, GaN transistors, ring oscillators, wide bandgap transistors etc. will be developed and the scopes of the corresponding terms are intended to include all such new technologies a priori.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment, and the text is to be construed as if such a single embodiment is explicitly written out in detail. Conversely, various features of the invention, which are, for brevity, described in the context of a single embodiment, may also be provided separately or in any suitable subcombination or as suitable in any other described embodiment of the invention, and the text is to be construed as if such separate embodiments or subcombinations are explicitly set forth herein in detail.

Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A power converter comprising an input, a power output and a plurality of ring oscillator stages connected between said input and said power output, the ring oscillator stages each comprising at least one enhancement mode transistor, wherein a drive connection of a first stage is connected via an impedance to a following stage and said impedance comprises an inductor.

2. The power converter of claim 1, wherein said ring oscillator stages respectively comprise a second enhancement mode transistor.

3. The power converter of claim 1, wherein the at least one enhancement mode transistor is at least one member of the group consisting of a SiC transistor and a Gallium Nitride transistor.

4. The power converter of claim 1, wherein the enhancement mode transistor is a wide bandgap transistor.

5. The power converter of claim 1, wherein at least one of said ring oscillator stages comprises a pull-up transistor and a pull-down transistor.

6. The power converter of claim 5, wherein said drive connection is between said pull-up transistor and said pull-down transistor.

7. The power converter of claim 1, wherein a drive connection of a final oscillator stage is connected via an impedance to a first ring oscillator stage.

8. The power converter according to claim 1, comprising a cascade of at least three of said ring oscillator stages.

9. The power converter of claim 1, wherein a drive connection of a first stage is connected via an impedance to a following stage.

10. The power converter of claim 9, wherein said ring oscillator stages respectively comprise at least two enhancement mode transistors.

11. The power converter of claim 9, comprising three of said ring oscillator stages, each of said three ring oscillator stages driving a switch for a different phase of a three phase system.

12. A power converter comprising an input, a power output and a plurality of ring oscillator stages connected between said input and said power output, the ring oscillator stages each comprising at least one enhancement mode transistor, wherein each ring oscillator stage is connected via an input impedance to said input and said input impedance comprises an inductance.

* * * * *